US005148058A

United States Patent [19]

Stewart

[11] Patent Number: 5,148,058

[45] Date of Patent: Sep. 15, 1992

[54] LOGIC CIRCUITS AS FOR AMORPHOUS SILICON SELF-SCANNED MATRIX ARRAYS

[75] Inventor: Roger G. Stewart, Neshanic Station, N.J.

[73] Assignee: Thomson, S.A., France

[21] Appl. No.: 620,682

[22] Filed: Dec. 3, 1990

[51] Int. Cl.[5] .................... H03K 19/096; H03K 19/20

[52] U.S. Cl. .................................... 307/453; 307/481; 377/74

[58] Field of Search ........................ 377/64, 73, 74, 81; 307/481, 482, 452, 453

[56] References Cited

U.S. PATENT DOCUMENTS 3,521,081 7/1970 Vasseur et al. .................... 307/453
3,599,010 8/1971 Crawford ............................ 377/74
4,651,028 3/1987 Mimoto .............................. 307/453
4,954,731 9/1990 Dhong et al. ....................... 307/452

*Primary Examiner*—Edward P. Westin
*Assistant Examiner*—Richard Roseen
*Attorney, Agent, or Firm*—Joseph S. Tripoli; Eric P. Herrmann; Ronald H. Kurdyla

[57] ABSTRACT

A logic circuit includes pull-up and pull-down transistors and a capacitance, the principal conducting paths of the transistors and the capacitance being coupled in series between a first supply bus and a source of time varying potential. The pull-up transistor is coupled to the capacitance and the capacitance is coupled to the time varying potential. First and second logic signals are applied to the control electrodes of the first and second transistors respectively. The time varying potential is arranged to limit the charge passed by the pull-up transistor permitting use of a relatively small pull-down transistor. The time varying potential has an amplitude sufficiently large to tend to stress the pull-up transistor if such transistor is non conducting. A selectively conductive element (diode) is coupled between a point of clamping potential and the interconnection of the pull-up transistor and capacitance.

11 Claims, 8 Drawing Sheets

FIG. 1
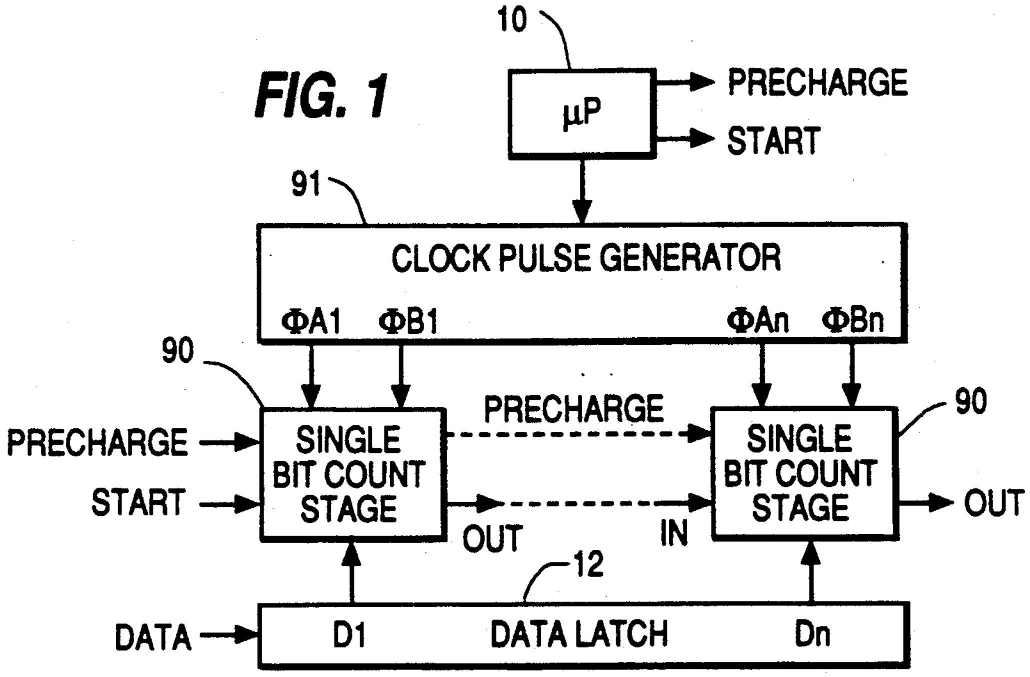
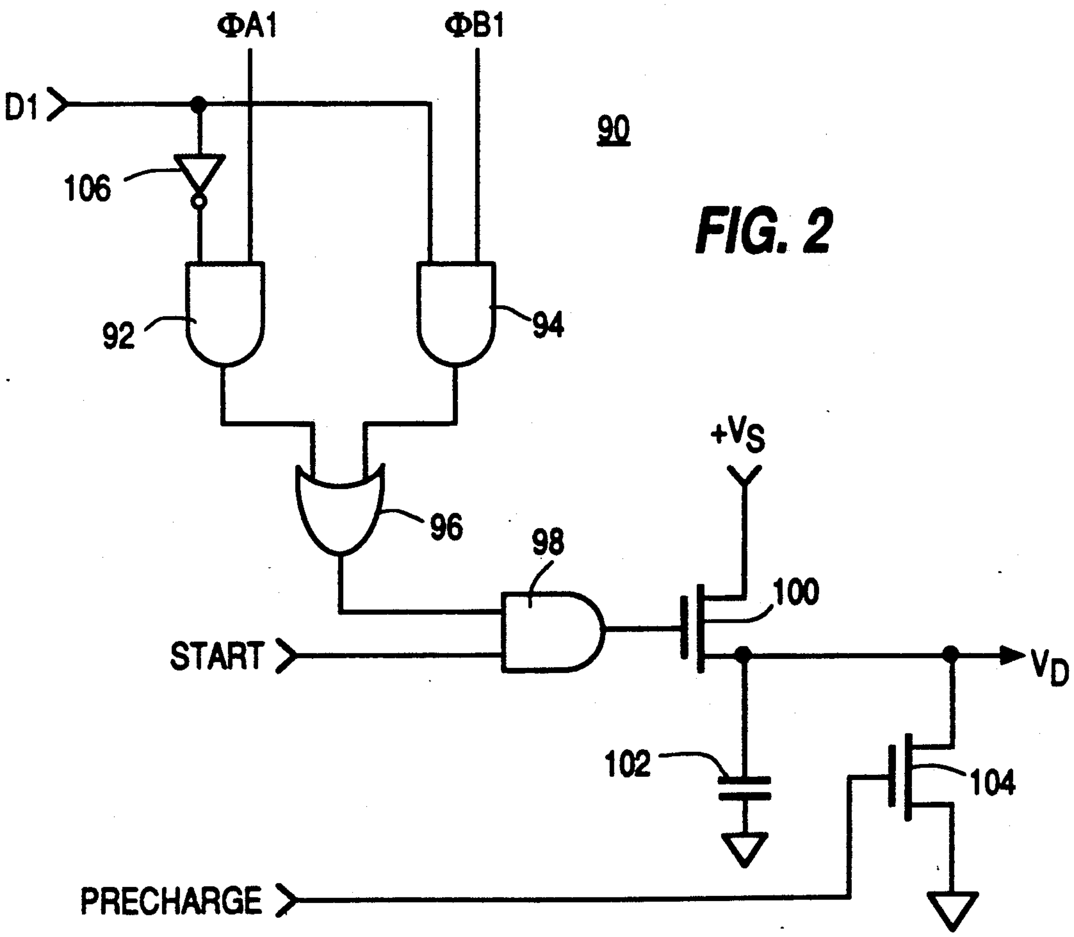
FIG. 2

LOGIC CIRCUITS AS FOR AMORPHOUS SILICON SELF-SCANNED MATRIX ARRAYS

This invention relates to circuitry for generating control pulses having pulse widths proportional to for example binary numbers applied to such circuitry.

BACKGROUND OF THE INVENTION

U.S. Pat. No. 4,742,346 issued to Gillette (included herein by reference) illustrates a liquid crystal display (LCD) device incorporating signal drive circuitry integrated together with the LCD elements on a common substrate. Included in the drive circuitry are a plurality of programmable counter circuits. Binary values representative of image brightness are applied to these counters which generate pulses having durations proportional to the binary values. The pulse durations are subsequently converted to potential amplitudes for application to individual display elements.

Consider that the pulses are to represent eight bit binary values, and the longest pulse is approximately equal to the active portion of one horizontal line of video signal, that is approximately 50 μsec. To satisfy these constraints the counter must count at a rate of approximately 5 MHz, e.g., the reciprocal of 50/256 μsec. Now if the counter circuitry is to be realized using amorphous silicon (aSi) transistors as is desirable for economic reasons, this counting rate tends to be too high to be supported by such circuitry. Secondly, programmable counters tend to be relatively complicated, requiring significant numbers of active devices.

SUMMARY OF THE INVENTION

The present invention includes logic circuitry which may be implemented with devices having relatively low carrier mobility as for example for generating variable width pulses in a self scanned LCD array.

The logic circuit includes pull-up and pull-down transistors and a capacitance, the principal conducting paths of the transistors and the capacitance being coupled in series between a first supply bus and a source of time varying potential. The pull-up transistor is coupled to the capacitance and the capacitance is coupled to the time varying potential. First (A) and second (B) logic signals are applied to the control electrodes of the first and second transistors respectively. The time varying potential (C) is arranged to limit the charge passed by the pull-up transistor permitting use of a relatively small pull-down transistor. The time varying potential has an amplitude sufficiently large to tend stress the pull-up transistor if such transistor is non conducting. A selectively conductive element (diode) is coupled between a point of clamping potential and the interconnection of the pull-up transistor and capacitance to limit the potential occuring thereat. In the foregoing arrangement the logic circuit provides the Boolean function $$A \cdot C \cdot \bar{B}$$

In a further exemplary embodiment the logic is arranged to perform the Boolean function $$(A \cdot C + \bar{A} \cdot D) \cdot \bar{B}$$

where D represents a second time varying signal.

BRIEF DESCRIPTION OF THE DRAWINGS

FIG. 1 is a block diagram of a variable pulse width generator.

FIG. 2 is a logic diagram of exemplary circuitry which may be implemented for the respective single bit variable pulse width generating stages of FIG. 1.

DETAILED DESCRIPTION

Figure 3:
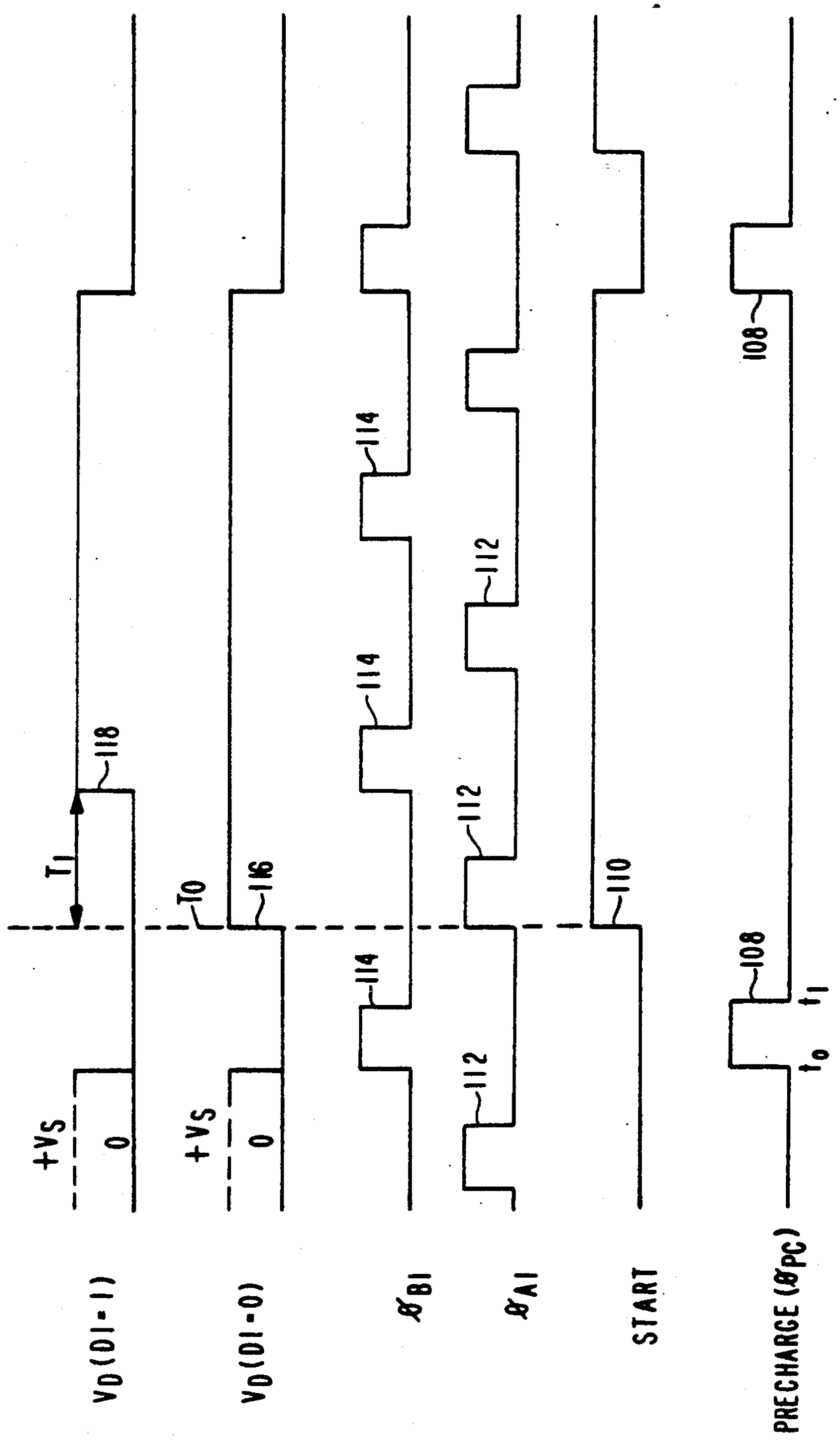
FIG. 3 shows potential waveforms useful for describing the FIG. 2 circuitry.

FIG. 1 shows in general block form the variable pulse width generator which includes a plurality of single bit stages 90. The single bit stages are connected in cascade for respectively processing digital data bits D1 through Dn, where n is any integer. The single bit stages 90 are each clocked by separate pairs of clock signals $\phi An$, $\phi Bn$, provided by a clock pulse generator 91.

Each of the cascade connected processing stages has a data bit input terminal for applying one bit of a data word representing the pulse duration; an output terminal and a start pulse input terminal. The start pulse input terminal of each successive processing stage in the cascade connection is coupled to the output terminal of the preceding stage. An externally generated start pulse is applied to the start pulse input terminal of the stage to which the MSB is applied. The data bits are decoded in the order of their bit significance, with each stage being successively enabled by an output transition provided by the next more significant bit stage, which transition corresponds to a predetermined transition of one of the clock phases $\phi An$, $\phi Bn$ applied to that stage. The stage that processes the least significant bit provides an output signal, $V_D$ which is a pulse of duration that represents the magnitude of the data word applied to all of the stages, or alternatively represents the time of occurence of the trailing transition of the variable width pulse.

FIG. 2 shows a logic circuit implementation of a single bit stage 90 of one embodiment of the invention. As shown, the single bit stage 90 includes a pair of AND gates 92 and 94, an OR gate 96, another AND gate 98, a switching transistor 100, a capacitor 102, another switching transistor 104, and an inverter 106. Operation of the single bit stage 90 of FIG. 2 will be described with reference to the timing diagram of FIG. 3. At the beginning of a variable width pulse interval, a precharge pulse 108 is applied to the gate electrode of transistor 104, turning this transistor on for the pulse time of pulse 108 and discharging storage capacitor 102 to a source of reference potential, ground in this example. This initializes the single bit stage 90. If the digital data bit $D_1$ applied to the single bit stage is a logic zero, it will disable AND gate 94 and enable AND gate 92 via inverter 106. On the application of a pulse 112 of clock $\phi A1$ to the other input of AND gate 92, the output from AND gate 92 will go high, providing a high input to OR gate 96. In turn, the output signal from OR gate 96 will go high and be applied to one input of AND gate 98. If the start signal 110 is high at this time, AND gate 98 is enabled, and its output signal will change from a low to a high level immediately upon the application of the high level input from OR gate 96. The high level output signal from AND gate 98 is applied to the gate electrode of transistor 100, conditioning it to charge capacitor 102 toward $+V_S$ and causing the output voltage $V_D$ to go high coincident with the positive transitions of the $\phi$A1 pulse (see waveform $V_D$ (D1=0).

If $D_1$ is a logic high level, that is a digital "1", inverter 106 will apply a "0" to one input of AND gate 92, disabling that AND gate, and a digital "1" is applied to one input of AND gate 94, enabling that AND gate. When clock pulse signal $\phi$B1 changes state to a digital "1", the output signal from AND gate 94 will change state from "0" to "1", which signal is coupled through OR gate 96 to one input of AND gate 98. Since AND gate 98 is already enabled via the high level start signal 110 connected to its other input terminal, the output signal from AND gate 98 will change from a "0" to a "1" state. The "1" stage conditions transistor 100 to provide a logic high output $V_D$ coincident with the positive transistions of the $\phi$B1, clock pulse (see waveforms VD(D1=1)).

In the FIG. 2 system the variable width output pulse starts with the leading edge of the precharge pulse and terminates at the leveling edge of either the $\phi$A1 or $\phi$B1 clock pulse. Alternatively the pulse may be considered as having a leading edge defined by the leading edge of either the $\phi$A1 or $\phi$B1 clock pulse, and a trailing edge defined by the leading edge of the precharge pulse. For typical LCD scanner applications the former definition of the variable clock pulse obtains.

The output signal $V_D$ from a single bit circuit 90 can be applied to the start input of a succeeding stage connected in cascade therewith, for arming or enabling the succeeding stage 90 in the chain, as will be described below. Prior to applying a new data bit to the stage 90, another stage precharge pulse 108 is applied to the gate of transistor 104 to discharge capacitor 102, and reinitialize the stage 90 for the next bit cycle.

Figure 4:
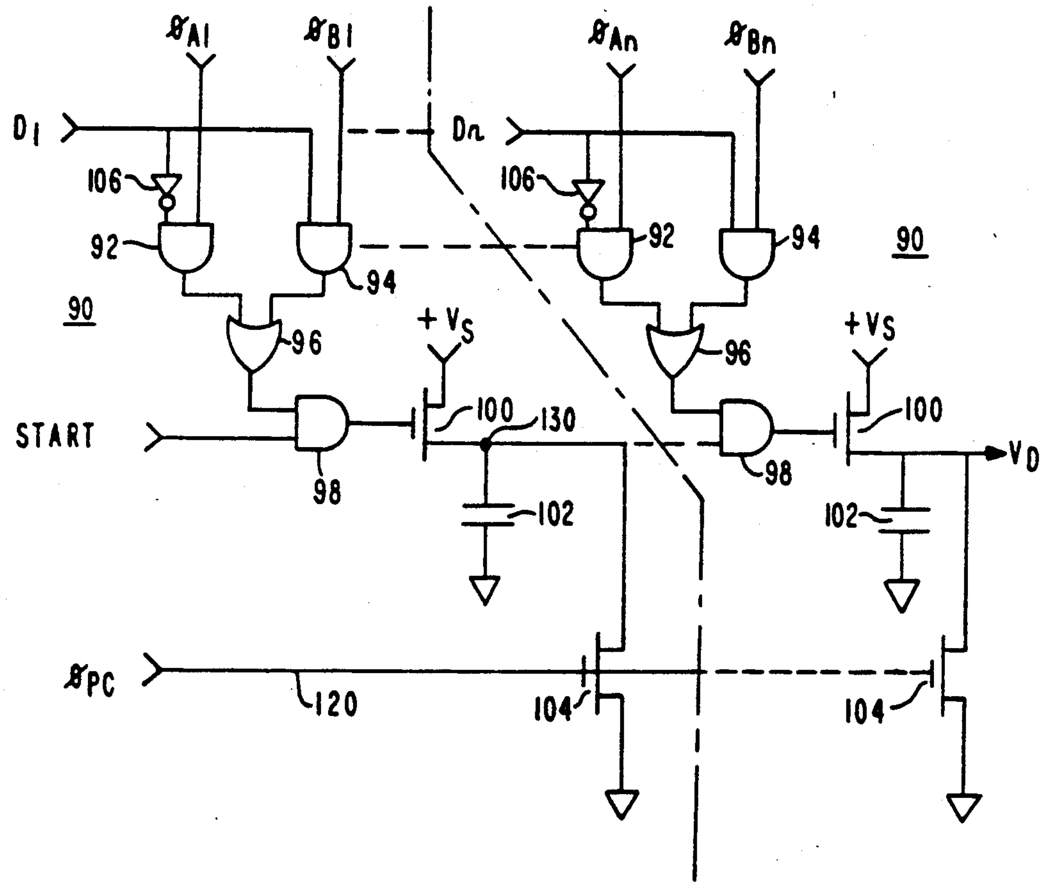
FIG. 4 is a logic schematic diagram showing the interconnection of two of the single bit stages illustrated in FIG. 2.

FIG. 4 illustrates the interconnection of a plurality of the single bit stages shown in FIG. 2, for processing or decoding a digital signal containing "n" bits. Note that a precharge signal line 120 is connected in common to the gate electrodes of the transistors 104 of each one of the single bit stages 90. Thus all stages are initialized simultaneously. Also note that two different clock pulses are required for each of the stages 90, with no one stage receiving the same clock pulses as another stage.

Figure 5:
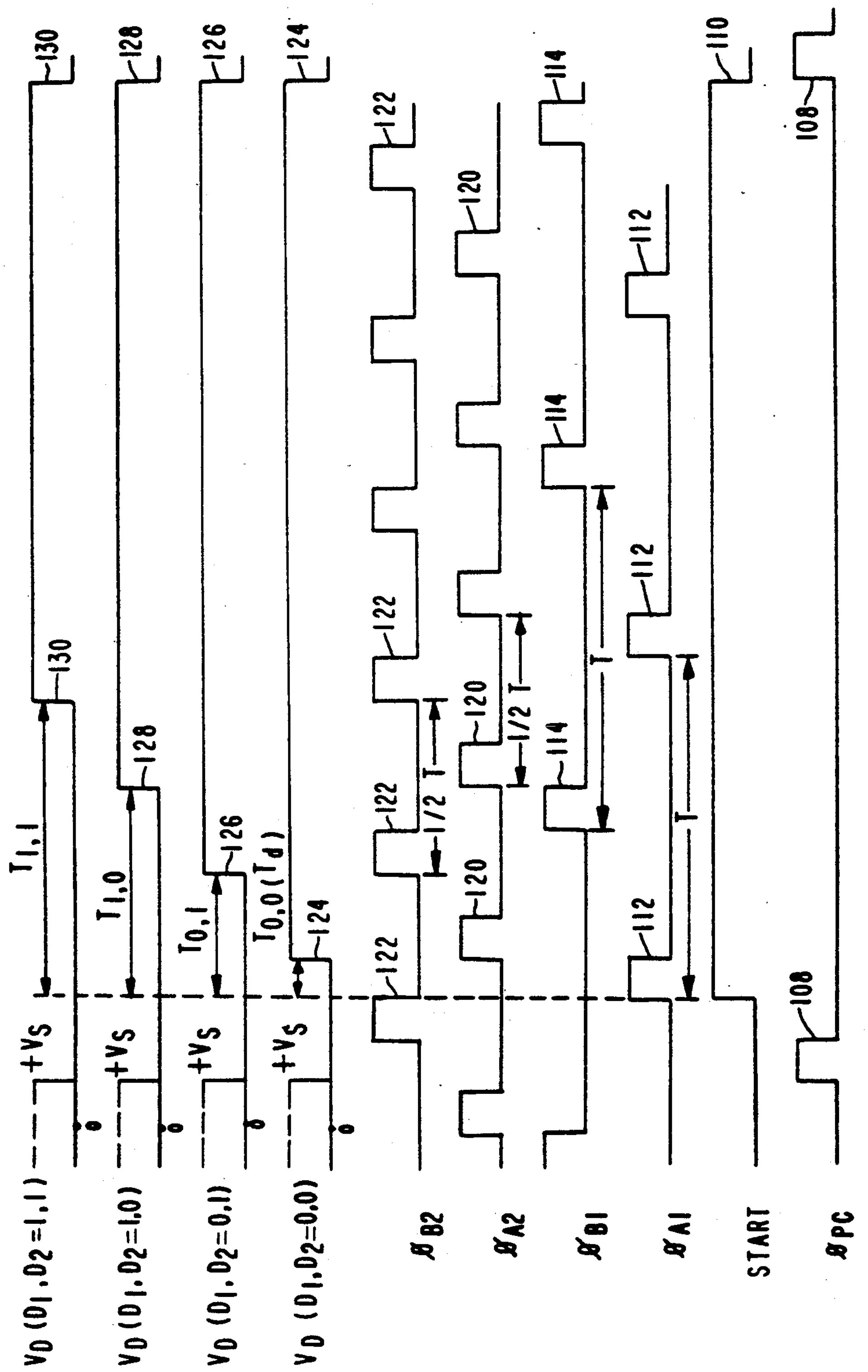
FIG. 5 is a waveform diagram illustrating the functionality of the FIG. 4 circuitry.

FIG. 5 illustrates a timing chart for the example where two single bit stages are connected in cascade for decoding a data signal having two bits D1, and D2. In FIG. 5, waveforms 108, 110, 112, and 114 are substantially similar to those of FIG. 3, and are associated with decoding the most significant bit of the digital data signal D1. Timing pulse waveforms 120 and 122 are associated with the clock pulses $\phi$A2 and $\phi$B2, respectively, for application to the second stage 90 for decoding the least significant bit D2, in this example.

The decoding of the most significant bit $D_1$ is substantially the same as the decoding process previously described for the single bit stage of FIG. 2. If $D_1$ is "0", node 130 of the first stage will go "high" responsive to the leading edge of the first occurring clock pulse $\phi$A1 shown as pulse 112 in FIG. 5. When node 130 goes "high", AND gate 98 of the next comparator stage 90 is enabled. Now if data bit $D_2$ is "0", the output signal $V_D$ will go "high" upon the occurrence of the next $\phi$A2 clock pulse shown as pulse 120 in FIGS. 5. The change in state of the output signal $V_D$ is indicated by waveform 124. This change in state occurs delayed in time by $T_{0,0}$ from the positive transition of the START signal. Alternatively, if data bit $D_2$ is "high" or "1", the output signal $V_D$ will go high coincident with the next occurring clock pulse $\phi$B2, as shown by waveform 126 which is delayed by $T_{0,1}$ indicated.

If $D_1$ is "1", the second stage AND gate 98 will be enabled upon the first occurrence (114) of the $\phi$B1 clock pulse after the positive transition of the start pulse 110. Assuming $D_2$ is a "0" the output $V_D$ will go high upon the occurrence of the next $\phi$A2 clock pulse (120) as shown by waveform 128 which is delayed by $T_{1,0}$. However, if $D_2$ is a "1", AND gate 92 of the second stage will be inhibited, and AND gate 94 enabled. As a result, transistor 100 of that stage will not be turned on until the occurrence of the next occurring $\phi$B2 clock pulse (122) with the output voltage transition being shown as waveform 130 which is delayed by $T_{1,1}$.

The four possible pulse width variation for a two bit signal and the particular clock signals $\phi$An, $\phi$Bn shown in FIG. 5 are illustrated by the waveforms 124–130. Note however that the transition points may be altered by changing the points in time at which clock transitions occur. Note further that once any stage provides a logic high output (at respective nodes 130), the output potential of that stage will not change regardless of changes in either data or clock states. This results because the output state is stored on the respective capacitors 102, which may only be discharged by transistors 104 when strobed by the precharge pulses $\phi$pc. Note further that the combination of transistors 100, 104 and capacitor 102 serves the function of a SET/RESET flip flop with $\phi$pc providing the set signal and AND gate 98 providing the reset signal. Thus where practical a bistable element may be substituted for transistors 100,104 and capacitor 102.

Figure 6:
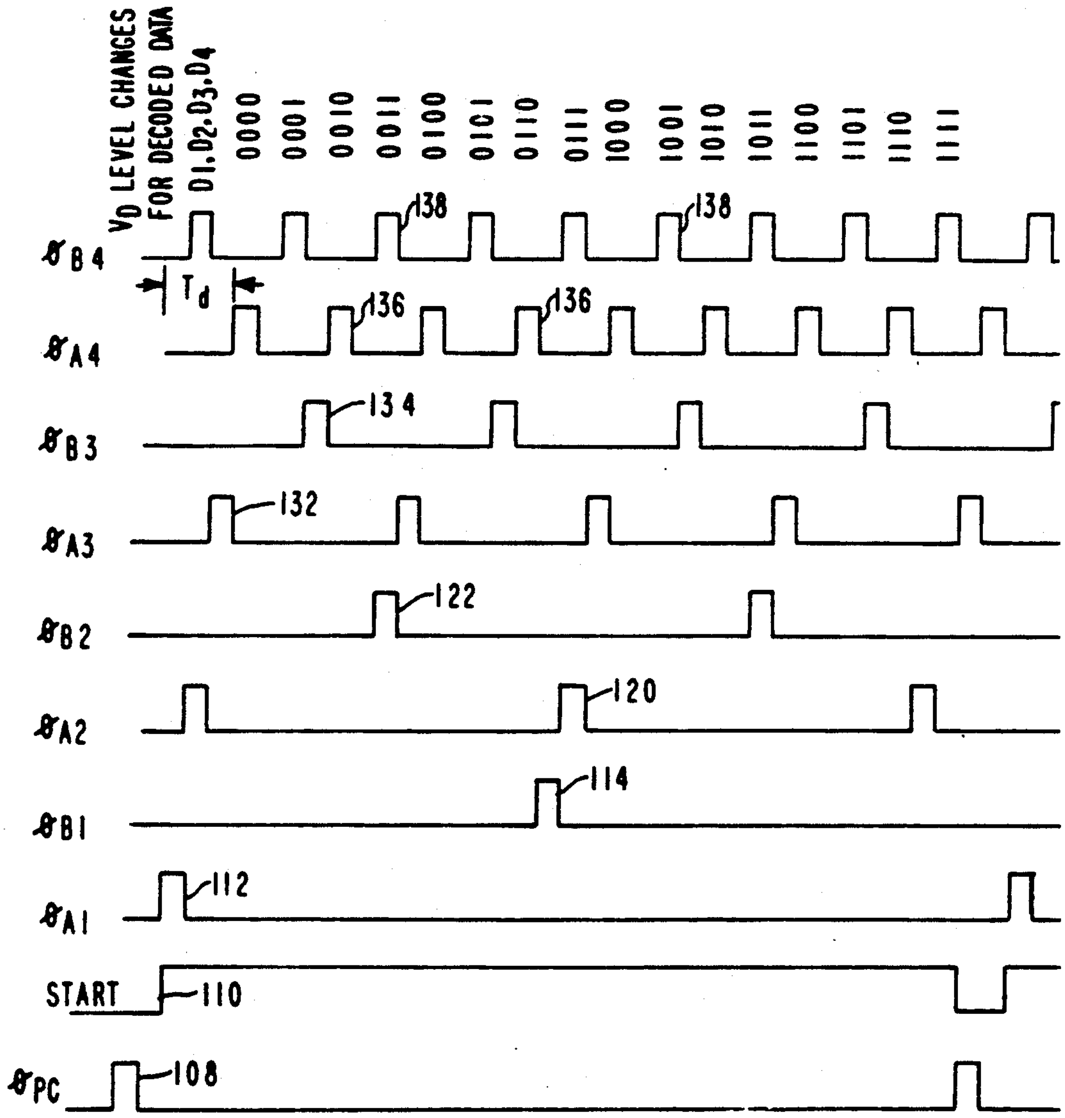
FIG. 6 is a waveform diagram illustrating the requisite clock waveforms for a four bit system.

The $\phi$A1 and $\phi$B1 clock cycles illustrated in FIG. 5, have a period T. The clock cycles $\phi$A2 and $\phi$B2, for the second or next succeeding cascaded stage 90, have a period of one-half T. Such a progression of reduced time periods by a factor of one-half for the clock cycles of one stage relative to a preceding stage is true in this example for any number of cascaded stages 90. Accordingly, if n=4, for decoding a four bit data signal having bits D1, $D_2$, $D_3$, and $D_4$, the timing chart would be as shown in FIG. 6. As shown, for decoding a four bit data word, four single bit stages 90 must be cascaded, requiring four different sets of clock pulses $\phi$A1 through $\phi$A4, and $\phi$B1 through $\phi$B4. Considering a digital data signal having a digital four bit value of "0000", the output voltage $V_D$ does not change level from a zero volt to a higher level until a delay time $T_d$ after the occurrence of the first $\phi$A1 clock pulse 112, as shown. This corresponds to $T_{0,0}$ in the two stage cascade of FIG. 5. The change in level occurs substantially at the initiation of the first occuring $\phi$A4 clock pulse 136, as shown.

Figure 7:
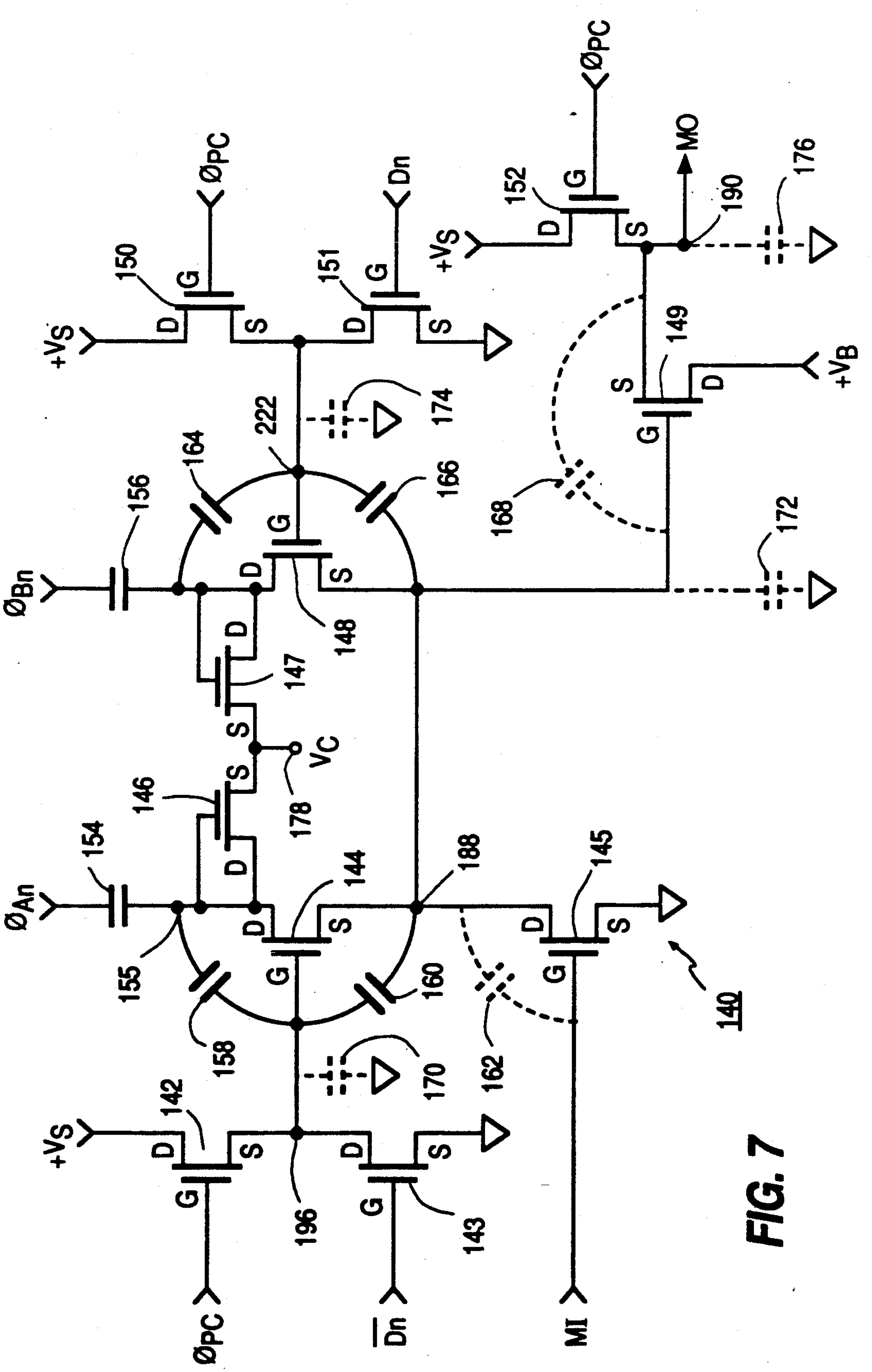
FIG. 7 is a schematic diagram of an alternative single bit variable pulse generating stage embodying the present invention.

FIG. 7 illustrates, another embodiment of a one-bit count circuit implemented in dynamic or pulsed logic. In this embodiment, a bootstrapping method is utilized to obtain sufficiently fast switching rates from slow pulsed logic devices such as amorphous silicon devices, permitting the circuit 140 to be used in the system of FIG. 1, for example. Each of the one-bit count stages 140 can be cascaded for decoding multiple data bit words, as previously indicated for the count stages 90. In this example, each count stage 140 includes transistors 142 through 152 of the same conductivity type; boost capacitors 154 and 156; interelectrode capacitors 158, 160, 164, 166, and shown and stray or parasitic capacitances 162, 168, 170, 172, 174, and 176, also shown in phantom.

First consider transistors 144, 148 having their respective source electrodes coupled to node 188 and transistor 145 having its drain electrode coupled to node 188. The source electrode of transistor 145 is coupled to ground potential. The drain electrodes of transistors 144 and 148 are respectively coupled via coupling capacitors 154 and 156 to clock busses φAn and φBn. Let the logic input values applied to the gate electrodes of transistor 144, 145 and 148 be Dn, MI and $\overline{Dn}$, respectively. The logic state of node 188 can be represented $$\text{NODE } 188 = (((Dn \cdot \phi An) + (\overline{Dn} \cdot \phi Bn)) \cdot \overline{MI}).$$

The signal MI corresponds to the start pulse, but is inverted in polarity relative to the start pulse discussed with respect to FIGS. 2 and 3. As long as the start pulse MI is high the output at node 188 will be low. Conversely, if MI is low and either Dn is high and φAn occurs or $\overline{Dn}$is high and φBn occurs, node 188 will exhibit a logic "1" on the occurrence of φBn or φAn. The output potential at node 188 is stored on the stray capacitance 172.

Input signal to the gate electrodes of transistors 144 and 148 and output signal from node 188 are provided by dynamic, precharge type buffer invertors. In FIG. 7 these buffer invertors include respective pairs (142, 143), (150, 151) and (152, 149) of transistors having their source-drain conduction paths coupled in series between relatively positive $+V_s$ and relatively negative supply potentials. Output signal from the buffer is taken from the interconnection of the pair of transistors. Input signal is applied to the gate electrode of the transistor coupled to the relatively negative supply potential and a precharge pulse is applied to the gate electrode of the transistor coupled to the relatively positive supply potential. The precharge pulse φpc occurs for a relatively short duration at the beginning of each bit period. (Note a bit period for an LCD video display application is a horizontal line time.) The data logic level applied to the signal input of the buffer inverter must be established prior to the termination of the precharge pulse. Refer to the buffer inverter comprising transistors 142 and 143 which generates the logic signal Dn applied to the gate electrode of transistor 144. The complement of Dn, $\overline{Dn}$provided by for example storage circuitry (not shown) is applied to the gate electrode of transistor 143. The precharge pulse φpc is applied to the gate electrode of transistor 142, and the logic signal Dn is available at node 196. If the input signal, e.g., Dn, is at a logic low state, rendering the pull-down transistor (143) nonconductive, the pull-up transistor (142) will charge the output node (196) to the positive supply potential Vs during the occurrence of the φpc pulse. At the termination of the precharge pulse the pull-up transistor (142) is rendered nonconductive leaving the potential Vs stored on the stray capacitance (170) associated with the output node of the buffer inverter.

Conversely, if the input signal ($\overline{Dn}$) is a logic high, the pull-down transistor (143) will be conducting, precluding the storage of any charge on the stray capacitance (170) associated with the buffer inverter output node (196). In this instance, at least shortly after the termination of the precharge pulse, the potential at the output node (196) of the inverter will be a logic low. Whether $\overline{Dn}$is a logic high or low, the logic value established on capacitor 170 is retained for a data word period, e.g., approximately the active portion of a horizontal line time for the LCD display application.

Precharge buffer invertors are used to apply the data bit values to the transistors 144 and 148 so that when a logic high level is applied to a respective gate electrode (144, 148), the impedance looking into the source of the data bit value is extremely high. This permits a capacitive voltage boost to the gate electrode as will be described hereinafter. Using a precharge buffer inverter wherein a charge is first stored on the output node of the inverter and then discharged according to the logic level of the applied data, obviates constructing the inverter with ratioed transistors. This permits relatively fast pull-down with relatively small pull-down transistors.

Regarding the input buffer invertors comprising transistors (142, 143) and (150, 151) the relatively negative supply potential applied thereto is assumed to be ground potential. With respect to the output buffer comprising transistors 152 and 149, the relatively negative supply potential is nominally ground potential, however it may be desirable to establish this potential at an amplitude slightly less than the turn on or threshold potential of the transistors 145. The reason for this is as follows. At the beginning of a bit cycle, the output node 190 is precharged to the positive supply potential Vs. This potential is stored on a relatively small stray capacitance 176. If the capacitor 176 is inadvertently discharged, it cannot be recharged (in this system) until the next bit cycle. Therefore, it is imperative that the pull-down transistor 149 be not inadvertently rendered conductive. Raising the potential applied to the source electrode of the transistor 149 raises the potential level which must be applied to its gate before it will turn on. Thus by applying the relatively more positive potential $V_B$ to the source electrode of transistor 149, the noise immunity of the system is increased. The amplitude of the supply $V_B$ is a value which determines the low level of the output signal MO. Since the output signal MO must be capable of exhibiting a logic low value, the amplitude of $V_B$ must be less than the maximum allowed for a logic low value.

The output signal MO is precharged to a logic "1" level at the beginning of a bit cycle and is discharged to a logic "0" level at the first occurrence of a positive pulse at node 188. This occurrence can only happen after the input signal MI goes low.

Figure 8:
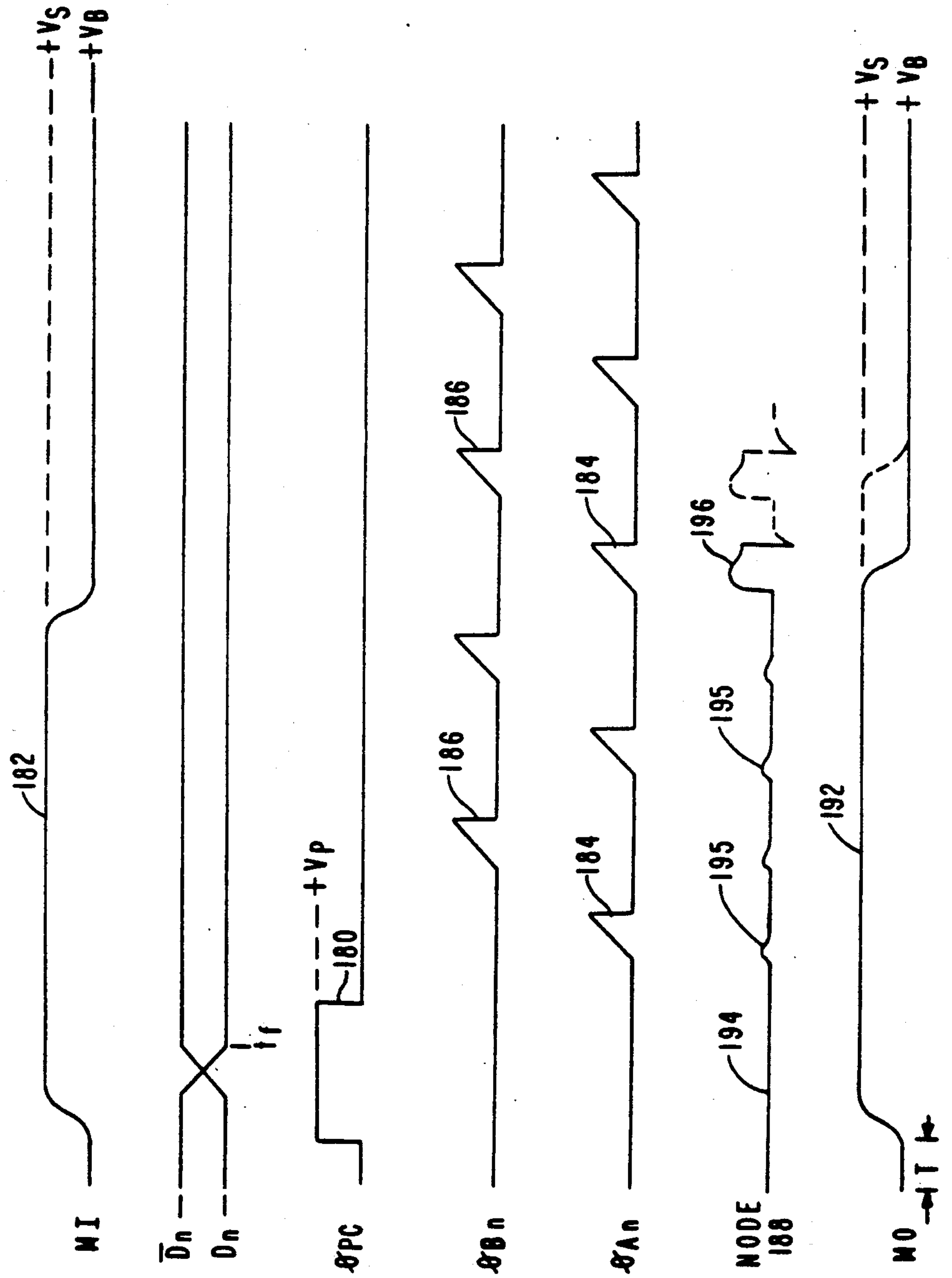
FIGS. 8, 9 and 10 illustrate waveforms descriptive of the operation of the FIG. 7 circuitry.

The relative timing of the FIG. 7 circuitry is illustrated by the FIG. 8 waveforms.

Referring again to FIG. 7, it is contemplated that all of the pull-up transistors 142, 144, 148, 150 and 152 are enhancement type, and thus charge their respective output nodes in the relatively slow source follower mode. With respect to the precharge buffer invertors this is of little consequence since precharging will nominally occur during the horizontal blanking intervals. The blanking intervals provide sufficient charging time even for relatively small, low mobility, pull-up transistors.

The charging time of node 188 by transistors 144 or 148 is another matter. Firstly, the drive voltage applied to the gates of transistors 144 and 148 is no larger than ($\phi$pc-$V_T$) where $\phi$pc is the amplitude of the precharge clock pulse applied to either transistor 142 or 150 and $V_T$ is the threshold potential of the transistors (which may be in the order of several volts). Secondly, the amount of time available is limited. Consider an active line interval of 53 μsec and 8-bit data samples. The clock period of the clock phases $\phi$A8, $\phi$B8 is 53/128 μsec or 0.415 μs, which is a relatively short period for charging node 188.

The charging capability of the transistors 144 and 148 is enhanced by boosting the gate drive potentials. Consider that node 196 exhibits a logic "1" and it is desired to charge node 188 via transistor 144. As is known, the larger the gate-source potential applied to a transistor the larger will be the current conducted thereby and consequently the shorter the charging time of a capacitive load.

The impedance looking into node 196 is substantially capacitive since both of the transistors 142 and 143 are not conducting (if node 196 exhibits a logic "1"). Consider a positive going clock pulse $\phi$A applied to the drain electrode 155 of transistor 144. Because there is a logic "1" potential biasing transistor 144 on, node 188 will begin to charge via the drain-source conduction path. Note, however, that a portion of the clock pulse $\phi$A applied to the drain electrode of transistor 144 will couple to its gate electrode via the capacitance 158, thereby enhancing the gate drive potential, and turning the transistor on harder. In addition, as node 188 begins charging, a portion of this potential is coupled back to the gate electrode, via the capacitance 160, enhancing the gate drive still more.

The capacitances 158, 160 and 170 are tailored relative to each other to a) boost the drive potential on the gate electrode of transistor 144 and enhance its current drive when a logic one is applied to its gate; b) insure that transistor 144 is not inadvertently turned on via coupling of clock potential to its gate electrode when transistor 143 is clamping the gate to ground and c) to insure that sufficient clock potential is not coupled via capacitors 158 and 160 to node 188 to inadvertently turn on transistor 149.

For various reasons it is desirable that transistor 145 be made as small as possible. This is accomplished by limiting the total charge available to charge capacitor 172 and by limiting the instantaneous current conducted by transistor 144 (148). The total available charge is limited by capacitively coupling the clock signal $\phi$An ($\phi$Bn) to the drain electrode of the transistor 144 (148). The instantaneous current is limited by providing clock pulses that have relatively long positive going transistions (see FIG. 8). However, because the clock signals are capacitively coupled to the transistors 144 (148) it is necessary that the amplitudes of the clock signals be increased. Depending on the relative values of the capacitors 154,158 and 172, the amplitude of the clock signal may have to be increased to a level which when coupled to the drain of transistor 144 may damage the transistor. Prevention of such damage is discussed hereinafter.

The maximum current available to transistor 144 (148) is proportional to Cdv/dt, where C is the value of the coupling capacitance and dv/dt is the rate of change of the clock signal. Transistor 145 need only be large enough to conduct the current Cdv/dt in order to maintain node 188 below the threshold potential of transistor 149 when the potential MI is high.

There is a further advantage to using a ramped clock signal. As long as the clock signal is increasing, the potential at the drain electrode of the transistor 144 (148) increases, and a portion of this increase is coupled to the gate of transistor 144 (148). This boost to the gate potential tends to ameliorate the undesirable limitations of the source follower charging characteristics of the field effect transistors 144 (148). Conversely if the clock signals had sharp risetimes, a relatively large potential would appear instantaneously at the drain electrodes of transistors 144 (148). If the transistor 144 (148) is conditioned to conduct, the potential at the drain electrode would decrease as the charge on its drain became depleted, and a negative potential would be coupled to its gate electrode (via capacitor 158) tending to exacerbate the source follower charging characteristics. In addition, an instantaneous large voltage at the drain electrode may tend to place a damaging strain on the device.

Whether the clock signal has a fast or slow risetime, the transistor 144 (148) which is conditioned to be nonconducting will have an excessive potential imposed on its drain electrode. To preclude such occurrence, diode connected transistors 146,147 are coupled between the respective drain electrodes and a point of bias potential, e.g. 15 volts. These diode connected transistors are poled to conduct when the potential on the respective drain exceeds the bias potential plus the threshold potential of the diode connected transistor, and thereby clamp the drain potential to a safe value. The diode connected transistors have virtually no effect on the drain potential of the transistor 144(148) which is conducting, because the charge coupled to the drain from the clock signal is discharged from the drain through the conducting transistor at almost a comparable rate, and as such the drain potential does not achieve the clamping potential.

Figure 9:
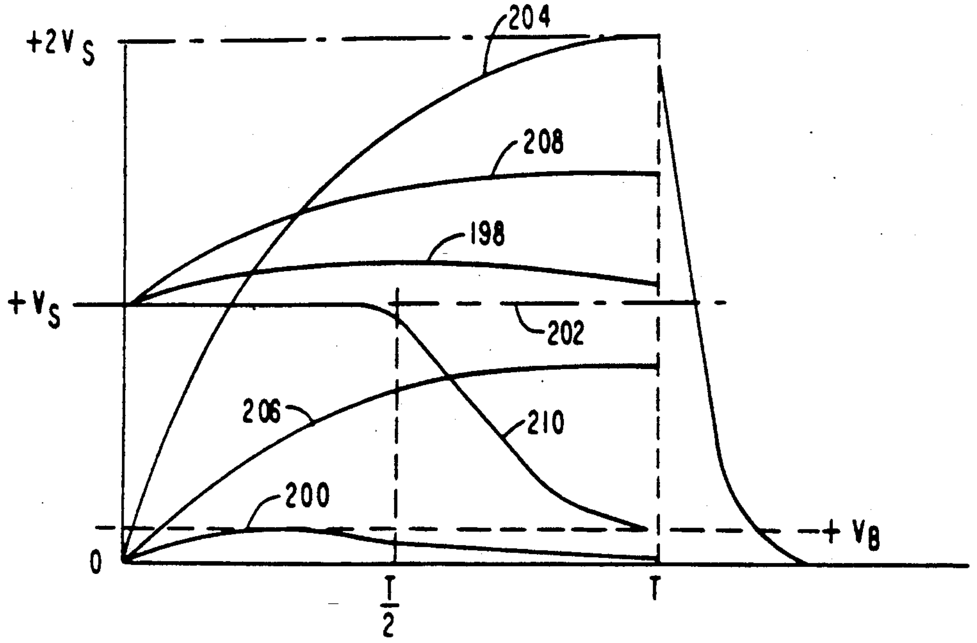

In FIG. 9, various waveforms are shown for a single bit stage 140 with transistor 143 nonconductive. Node 196 has a voltage level over a period of time T as shown by curve 198. Since node 196 is substantially at $+V_S$ statically, or slightly greater than this level, transistor 144 will be turned on. Note that curve 198 is representative of the voltage at node 196 at times that $\overline{D}_n$ is "low", and the MI or start input signal is "high". Also, under these conditions, curve 200 shows the small voltage impulses 195 at node 188, curve 202 the voltage ($+V_S$) at node 190, and the waveform 204 is representative of a clock signal for either the $\phi$An or $\phi$Bn clocks. If the MI signal goes "low" with other signal conditions remaining the same, then node 188 will undergo a voltage transition as shown by curve 206, and node 196 will have a voltage as shown by curve 208, when the boost drive $\phi$An or $\phi$Bn is applied in the form of clock signal 204 to the count stage 140. The curve 210 is illustrative of the discharging of node 190 when node 188 goes high. In practice, computer simulations have shown that node 190 does not discharge appreciably until about a time T/2 has elapsed, as shown in FIG. 9 for waveform 210. This characteristic may be utilized for enhancing timing for a plurality of cascaded stages.

In FIG. 9, if the MI signal is "high" when either the $\phi$An or $\phi$Bn clocks occur, then transistor 145 remains conducting, and node 188 can rise only a moderate amount in voltage magnitude as shown by curve 200, even with transistor 144 remaining conductive. The rise in voltage at node 188, at this time (waveform 200), is insufficient to turn on transistor 149, unless the voltage increase exceeds the voltage level equivalent to the threshold voltage ($V_{TH}$). Accordingly, a single impulsive voltage 200 at node 188 at this time does not cause any discharge of node 190. A number of such sub-threshold impulses may have a cumulative affect, however, and may cause significant discharge, over a long time interval, such as 50.0 μs after termination of the precharge pulse 180. To insure that such false discharging does not occur, it was experimentally determined that the maximum impulse amplitude 195 (waveform 200) should be about 3.0 volts below the voltage threshold $V_{TH}$ of transistor 149.

Figure 10:
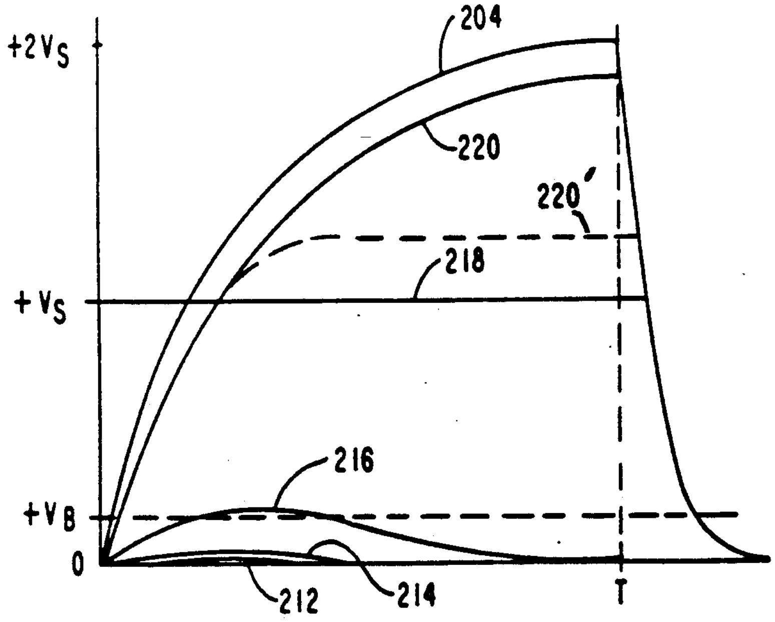

In stage 140 of FIG. 7, assume that the $D_n$ data bit is "low", and $\overline{Dn}$ is "high", thereby turning on transistor 143. The voltage waveforms associated with various nodes under this condition are shown in FIG. 10. Curve 216 shows the voltage at node 196 as it appears regardless of whether the MI signal is "low" or "high". Curve 212 shows the very small resultant disturb voltage at node 188 if the MI signal is "high". Curve 214 shows the somewhat larger voltage at node 188 if the MI signal is "low". Curve 218 is representative of the voltage at node 190, showing that the MO signal remains at $+V_S$ (voltage at node 190), and curve 220 shows the quite high voltage swing appearing at node 155; this voltage 220 now can approach curve 204 in amplitude since device 144 is now nonconductive. This high voltage swing can tend to turn 144 "on" via coupling through capacitor 158. To prevent this, clamping transistors 146 and 147 are provided to limit the amplitude of the curve 220 relative to curve 204. The limited amplitude is illustrated by the curve 220'.

With one channel transistor 143 conductive, and the other channel transistor 151 nonconductive, or vice versa, an impulse at node 188 will attain an insignificant level provided that transistors 144 or 148, respectively, remain turned off during times of occurrence of a φAn or φBn channel clock pulse 204, respectively. Assuming that this is the case, transistors 143 and 151 must be made large enough from a device standpoint to maintain the voltage at node 196 or at node 222, respectively, to less than a transistor threshold voltage above the voltage appearing at node 188, during the times of occurrence of pulse 204 for either φAn or φBn. In practice, if the period T (FIG. 9 or 10) is equal to 0.7 μs, transistors 143 and 151 each having channel widths w, equal to 15.0 microns will suffice, assuming that transistors 144 and 148 each have channel widths w equal to 200.0 microns. Accordingly, in this manner, small data switching devices provide control of much large switching devices. This characteristic is believed unique to the present precharged node, bootstrapped circuit stages 140.

What is claimed is:

1. A logic circuit comprising:

a source of supply potential;

a source of first and second control signals;

a source of third control signal;

a capacitor;

first and second transistors respectively having first and second electrodes and a principal conduction path therebetween, and having respective control electrodes, the first electrode of said first transistor being coupled to the second electrode of the second transistor and forming an output terminal thereat, the first electrode of said second transistor being coupled to said source of supply potential, and said capacitor being coupled between the second electrode of said first transistor and said source of third control signal;

means for applying said first and second control signals to the control electrodes of said first and second transistors respectively;

selectively conductive means, coupled to the second electrode of said first transistor, for preventing potentials occurring at the second electrode of said first transistor from exceeding a predetermined amplitude.

2. The logic circuit set forth in claim 1 wherein said means for applying said first control signals to the control electrode of said first transistor presents a high impedance during an interval when said first transistor is conditioned to conduct.

3. The logic circuit set forth in claim 2 further including a further capacitor coupled between the first and control electrodes of said first transistor.

4. The logic circuit set forth in claim 1 further including:

a third transistor similar to said first transistor;

a further selectively conductive means similar to said selectively conductive means;

a further capacitor;

a source of fourth control signal, said fourth control signal having a phase different than said third control signal, wherein said forth control signal is coupled to the second electrode of said third transistor by said further capacitor and said first electrode of said third transistor is coupled to the second electrode of said second transistor;

means for coupling a signal to the control electrode of said third transistor which is the complement of signal coupled to the control electrode of said first transistor; and means coupling said further selectively conductive means to the second electrode of said third transistor for preventing potentials occurring at the second electrode of said third transistor from exceeding said predetermined amplitude.

5. The logic circuit set forth in claim 4 further including a fourth transistor having first and second electrodes and a principal conduction path therebetween, and having control a electrode, the control electrode of said fourth transistor being coupled to the first electrode of said first and third transistors and the first electrode of said fourth transistor being coupled to said supply potential; and load means coupled to the second electrode of said fourth transistor.

6. Logic means comprising:

respective sources of first and second bilevel signals;

at least one transistor having a principal conduction path between first and second electrodes, and having a control electrode;

a capacitor for coupling said first bilevel signal to said first electrode;

means for coupling said second bilevel signal to said control electrode;

means coupled to said first electrode for preventing potentials occurring at said first electrode from exceeding a predetermined potential; and an output node coupled to said second electrode.

7. The logic means set forth in claim 6 including means including at least one further capacitor coupled between one of said first and second electrodes and said control electrode for applying a voltage boost from said one of said first and second electrodes and said control electrode.

8. The logic means set forth in claim 6 wherein said means for coupling said second bilevel signal to said control electrode includes:

a further transistor having a principal conduction path coupled between said control electrode and a source of supply potential and having a control electrode coupled to said source of second bilevel signal; and means for selectively charging the control electrode of said at least one transistor to a predetermined potential different from said supply potential.

9. Logic apparatus comprising:

sources of first and second potentials;

respective sources of first, second and third bilevel signals, said third bilevel signal having relatively long leading transitions compared to trailing transitions and having an amplitude of magnitude sufficient to cause breakdown of a transistor to which it is applied;

an output node;

first, second and third transistors having respective control, first and second electrodes, the first electrodes of said first and second transistors being interconnected, the second electrode of said second transistor and the first electrode of said third transistor being coupled to said output node, the second electrode of said third transistor being coupled to said source of first potential and the second electrode of the first transistor being coupled to said source of second potential;

means for coupling the sources of first and second bilevel signals to the control electrodes of said second and third transistors respectively;

means coupled to the control electrode of said first transistor to condition said first transistor to prevent potentials occurring at its first electrode from exceeding a predetermined potential less than said magnitude; and a capacitor coupled between said source of third bilevel signal and the first electrode of said first and second transistors.

10. The apparatus set forth in claim 9 wherein said first transistor is connected as a diode.

11. The apparatus set forth in claim 1 wherein said third control signal has pulses with relatively long leading transitions compared to the trailing transitions of said pulses.

* * * * *